(12) United States Patent (10) Patent No.: US 12,354,869 B2
Nagashima (45) Date of Patent: Jul. 8, 2025

(54) SUBSTRATE TREATMENT METHOD AND SUBSTRATE TREATMENT APPARATUS

(71) Applicant: Shibaura Mechatronics Corporation, Yokohama (JP)

(72) Inventor: Yuji Nagashima, Yokohama (JP)

(73) Assignee: SHIBAURA MECHATRONICS CORPORATION, Kanagawa (JP)

( * ) Notice: Subject to any disclaimer, the term of this patent is extended or adjusted under 35 U.S.C. 154(b) by 479 days.

(21) Appl. No.: 17/372,931

(22) Filed: Jul. 12, 2021

(65) Prior Publication Data

US 2022/0037149 A1 Feb. 3, 2022

(30) Foreign Application Priority Data

Jul. 30, 2020 (JP) ................. 2020-129286

(51) Int. Cl.
*H01L 21/02* (2006.01)
*A46B 9/00* (2006.01)
*A46B 13/00* (2006.01)
*A46B 13/02* (2006.01)
*B08B 1/12* (2024.01)
*B08B 1/32* (2024.01)
*H01L 21/67* (2006.01)

(52) U.S. Cl.
CPC ........ *H01L 21/02096* (2013.01); *A46B 9/005* (2013.01); *A46B 13/008* (2013.01); *A46B 13/02* (2013.01); *B08B 1/12* (2024.01); *B08B 1/32* (2024.01); *H01L 21/67046* (2013.01); *A46B 2200/3073* (2013.01)

(58) Field of Classification Search
CPC .......... H01L 21/02096; H01L 21/3212; H01L 21/0209; B24B 53/017
See application file for complete search history.

(56) References Cited

U.S. PATENT DOCUMENTS 5,810,964 A * 9/1998 Shiraishi ............... B24B 53/017
451/286
6,194,317 B1 2/2001 Kaisaki et al.
(Continued)

FOREIGN PATENT DOCUMENTS

JP 2001-523395 A 11/2001
JP 2007110066 A * 4/2007 ............ B24B 37/30
(Continued)

*Primary Examiner* — Dah-Wei D. Yuan
*Assistant Examiner* — Andrew J Bowman
(74) *Attorney, Agent, or Firm* — MCDONALD HOPKINS LLC (57) ABSTRACT

According to one embodiment, a substrate treatment method of removing an upper end of a protrusion on a substrate is disclosed. An unevenness is formed on a surface of the substrate. The method can supply a first liquid on the surface of the substrate. The unevenness is formed on the surface. The method can form a protective layer. The protective layer covers the surface of the substrate from the first liquid supplied to the surface of the substrate. The method can supply a second liquid onto the protective layer. In addition the method can physically remove the protective layer which is on the upper end of the protrusion, and can bring the second liquid into contact with the upper end of the protrusion. The protective layer is removed from the upper end of the protrusion.

6 Claims, 6 Drawing Sheets

(56) References Cited

U.S. PATENT DOCUMENTS

| | | | |
|---|---|---|---|
| 6,620,725 B1 * | 9/2003 | Shue | H01L 21/3212 |
| | | | 438/692 |
| 2003/0045090 A1 * | 3/2003 | Tsuchiya | H01L 21/0209 |
| | | | 257/E21.583 |
| 2008/0026583 A1 | 1/2008 | Hardy et al. | |
| 2008/0067077 A1 | 3/2008 | Kodera et al. | |
| 2013/0119013 A1 | 5/2013 | Matsui et al. | |
| 2018/0265989 A1 | 9/2018 | Yoshimizu et al. | |
| 2018/0269082 A1 | 9/2018 | Yoshimizu et al. | |
| 2018/0331066 A1 | 11/2018 | Uzoh et al. | |
| 2021/0090913 A1 | 3/2021 | Yoshimizu et al. | |

FOREIGN PATENT DOCUMENTS

| | | |
|---|---|---|
| JP | 2008-196047 A | 8/2008 |
| JP | 2013-128096 A | 6/2013 |
| JP | 2019-054227 A | 4/2019 |
| JP | 2020-520118 A | 7/2020 |
| KR | 10-2003-0020847 A | 3/2003 |

\* cited by examiner

SUBSTRATE TREATMENT METHOD AND SUBSTRATE TREATMENT APPARATUS

CROSS-REFERENCE TO RELATED APPLICATIONS

This application is based upon and claims the benefit of priority from Japanese Patent Application No. 2020-129286, filed on Jul. 30, 2020; the entire contents of which are incorporated herein by reference.

FIELD

Embodiments described herein relate generally to a substrate treatment method and a substrate treatment apparatus.

BACKGROUND

In the manufacturing process of semiconductor devices, flat panel displays, etc., an unevenness such as patterns may be formed on the surface of the substrate. Then, a treatment of removing the upper end of the protrusion formed on the surface of the substrate may be performed.

For example, the upper end of the protrusion is chemically and mechanically removed by CMP (Chemical Mechanical Polishing) process. However, in the CMP process, since the polishing pad is directly brought into contact with the surface of the substrate for polishing, when the upper end of the protrusion is removed, for example, the side wall or the bottom portion of the recess may be damaged. Furthermore, the abrasive may remain inside the recess, and the abrasive remaining inside the recess may make treatment in the post-process difficult.

Further, for example, the upper end of the protrusion is removed by a dry etching process using a high-density plasma. Although the dry etching process is excellent in microfabrication, etching proceeds to the inside of the recess, and for example, the side wall and the bottom of the recess may be damaged.

Further, for example, the upper end of the protrusion is chemically removed by a wet etching process. However, in the wet etching process, the chemical solution also penetrates into the recess, so that, for example, the side wall and the bottom of the recess may be damaged.

Further, for example, a technique has been proposed in which an uneven member functioning as a catalyst is pressed against the surface of a substrate and a chemical solution is supplied to the surface of the substrate to remove the upper end of the protrusion. However, since the portion not touched by the uneven member functioning as the catalyst is not removed, there is a possibility that the removal residue may be left on the surface of the substrate. In addition, the chemical solution that has penetrated the inside of the recess may cause damage to the side wall or bottom of the recess, for example.

Therefore, it has been desired to develop a technique which can remove the upper end of the protrusion and suppress the occurrence of damage to the recess in the substrate having the unevenness formed on the surface.

DETAILED DESCRIPTION

According to one embodiment, a substrate treatment method of removing an upper end of a protrusion on a substrate is disclosed. An unevenness is formed on a surface of the substrate. The method can supply a first liquid on the surface of the substrate. The unevenness is formed on the surface. The method can form a protective layer. The protective layer covers the surface of the substrate from the first liquid supplied to the surface of the substrate. The method can supply a second liquid onto the protective layer. In addition the method can physically remove the protective layer which is on the upper end of the protrusion, and can bring the second liquid into contact with the upper end of the protrusion. The protective layer is removed from the upper end of the protrusion.

Various embodiments are described below with reference to the accompanying drawings.

In the specification and drawings, similar components are marked with like reference numerals, and a detailed description is omitted as appropriate.

(Configuration of Substrate)

First, a substrate treatment method according to the present embodiment and a substrate 100 treated by a substrate treatment apparatus 1 will be described.

Figure 1:
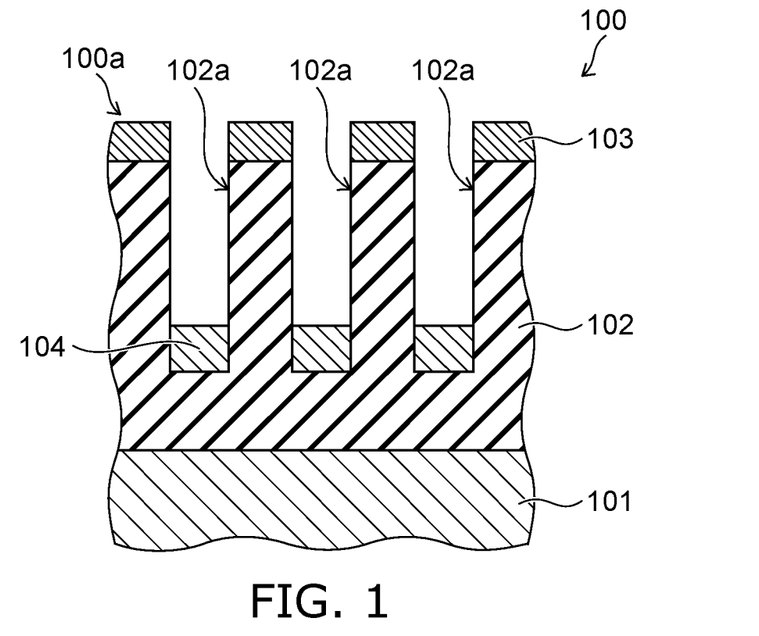
FIG. 1 is a schematic cross-sectional view for illustrating a substrate.

FIG. 1 is a schematic cross-sectional view for illustrating the substrate 100.

In the following, as an example, a case where the substrate 100 is a semiconductor substrate such as a wafer will be described. However, the substrate 100 is not limited to a semiconductor substrate, and can be, for example, a substrate used for a flat panel display such as a liquid crystal panel or a microstructure such as MEMS (Micro Electro Mechanical Systems).

As shown in FIG. 1, the substrate 100 has, for example, a base 101, a first layer 102, a second layer 103, and a third layer 104.

The base 101 has a plate shape and includes a semiconductor material such as silicon.

The first layer 102 is provided, for example, in at least a portion of one surface of the base 101. The first layer 102 can be, for example, an insulating layer. The insulating layer can be formed, for example, by oxidizing the surface of the base 101 or forming an oxide film, a nitride film, an oxynitride film, or the like on the base 101. The insulating layer can include, for example, silicon oxide. Further, the first layer 102 may be, for example, a stacked film in which an insulating layer, a semiconductor layer, a conductor layer and the like are stacked. When the first layer 102 is the stacked film, end portions of the insulating layer, the semiconductor layer, the conductor layer, and the like are exposed on the side wall of the recess 102a.

The first layer 102 is provided with at least one recess 102a. The substrate 100 illustrated in FIG. 1 is provided with multiple recesses 102a. The recess 102a is open on the upper surface of the first layer 102. The recess 102a can be, for example, a hole or a trench. The depth of the recess 102a can be, for example, about 4 μm to 5 μm. The opening size (for example, hole diameter or trench width) of the recess 102a can be, for example, about 100 nm.

The recess 102a can be formed by, for example, a plasma etching process such as RIE (Reactive Ion Etching). When performing the plasma etching process, the second layer 103 provided on the first layer 102 can be used as an etching mask.

The second layer 103 is provided on the first layer 102. The second layer 103 has a hole communicating with the recess 102a. The second layer 103 covers the portion of the first layer 102 where the recess 102a is not open. That is, the second layer 103 can be an upper end of the protrusion provided on the surface of the substrate 100.

The second layer 103 can be, for example, a metal mask (hard mask). The metal mask can be formed, for example, by etching a film provided on the first layer 102. The metal mask, which is the second layer 103, includes, for example, at least one of a metal and a metal oxide. The metal can include, for example, at least one of tungsten (W), cobalt (Co), ruthenium (Ru), nickel (Ni), iron (Fe), hafnium (Hf), copper (Cu), and chromium (Cr). The metal oxide can be an oxide of these metals.

Further, the second layer 103 may be, for example, a resist mask including an altered layer on the surface. For example, when ions are incident on the surface of the resist mask during ion implantation or the like, the surface of the resist mask may be altered to form the altered layer. Since the altered layer has higher physical resistance and chemical resistance than the resist, if the altered layer is formed on the surface, it may be difficult to remove it by a general dry etching process or wet etching process.

In addition, a third layer 104 may be provided. The third layer 104 can be, for example, a metal interconnect layer or a semiconductor layer exposed at the bottom of the recess 102a. The third layer 104 can be formed from, for example, a metal or metal oxide containing at least one of tungsten, cobalt, ruthenium, nickel, iron, hafnium, copper and chromium. In this case, the material of the third layer 104 may be the same as or different from the material of the second layer 103.

In the substrate 100 configured as described above, multiple holes of the second layer 103 are opened on the surface 100a thereof. The multiple holes in the second layer 103 communicate with the multiple recesses 102a provided in the first layer 102. Therefore, the surface 100a of the substrate 100 will be formed with the multiple recesses 102a provided in the first layer 102 and an unevenness formed by a multiple holes provided in the second layer 103 communicating with the recesses 102a. Therefore, the surface 100a is a surface on which the unevenness of the substrate 100 is formed.

Since known techniques can be applied to the configuration and forming method of the base 101, the first layer 102, the recess 102a, the second layer 103, and the third layer 104, detailed description thereof will be omitted.

Here, when the substrate 100 is used as a substrate for a microstructure, the second layer 103 may not be required. For example, if the second layer 103 is provided, it may interfere with the post process or the function of the substrate 100 may be hindered. When removing the second layer 103, the second layer 103 is generally removed by a CMP process, a dry etching process, a wet etching process, or the like.

However, when the second layer 103 is a metal mask or a resist mask having an altered layer on the surface, it is difficult to remove the second layer 103, so it is necessary to improve the physical removal conditions and the chemical reactivity. Therefore, when the second layer 103 is removed by using a CMP process, a dry etching process, a wet etching process, or the like, the side wall or bottom of the recess 102a or the third layer 104 mat be damaged by the abrasive, radicals, ions, or the etching solution. In addition, the abrasive or the like may remain inside the recess 102a.

Therefore, in the substrate treatment method according to the embodiment, the second layer 103 is removed as follows.

(Substrate Treatment Method)

Next, the substrate treatment method according to the embodiment will be described.

FIGS. 2 to 7 are schematic process cross-sectional views for illustrating the substrate treatment method.

Figure 2:
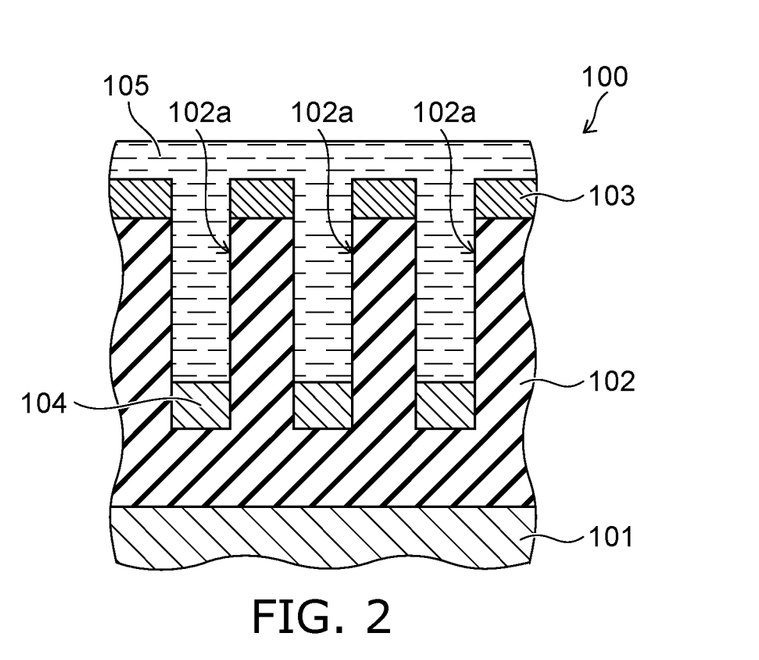
FIG. 2 is a schematic process cross-sectional view for illustrating a substrate treatment method.

First, as shown in FIG. 2, a first liquid 105 is supplied to the surface of the substrate 100 on the side where the second layer 103 is provided. The first liquid 105 can be, for example, discharged from a nozzle or sprayed from a spray nozzle. The surface of the second layer 103 is covered with the supplied first liquid 105. The first liquid 105 is also supplied to the inside of the recess 102a.

Here, since the protective layers 105a and 105b described later are formed from the first liquid 105, the thickness of the first liquid 105 is controlled so that the protective layers 105a and 105b having an appropriate thickness are formed. The thickness of the first liquid 105 can be controlled, for example, by the supply amount (supply time) and viscosity of the first liquid 105, the rotation speed of the substrate 100, and the like. The viscosity of the first liquid 105 can be controlled, for example, by the type of the vaporizable rust inhibitor described later, the ratio (concentration) of the vaporizable rust inhibitor to the solvent, and the like. The thickness of the first liquid 105 can be appropriately determined by conducting experiments and simulations in advance.

The first liquid 105 comes into contact with the surface of the substrate 100 on the side where the second layer 103 is provided. Therefore, the first liquid 105 preferably includes a material of the base 101, a material of the first layer 102, and a material that does not easily react with the material of the third layer 104. Further, as described later, the protective layers 105a and 105b formed from the first liquid 105 have a function of protecting the surface of the substrate 100 from a second liquid 106 described later. Therefore, the first liquid 105 preferably includes a material that does not easily react with the second liquid 106. Further, as will be described later, since the protective layers 105a and 105b are formed by drying the first liquid 105, it is preferable that the first liquid 105 is a liquid that easily vaporizes.

The first liquid 105 can include at least a vaporizable rust inhibitor. Examples of the vaporizable rust inhibitor include Benzo triazole, Tolyl triazole (Methyl benzotriazole), Dicyclohexyl ammonium nitrite, Dicyclohexyl ammonium salicylate, Monoethanolamine benzoate, Dicyclohexyl ammonium benzoate, Diisopropyl ammonium benzoate, Diisopropyl ammonium nitrite, Cyclohexylamine carbamate, Nitro naphthalene ammonium nitrite, Cyclohexylamine benzoate, Dicyclohexyl ammonium cyclohexane carboxylate, Cyclohexylamine cyclohexane carboxylate, Dicyclohexyl ammonium acrylate, Cyclohexylamine acrylate etc. can be exemplified.

When the vaporizable rust inhibitor is a liquid, the vaporizable rust inhibitor can be used as the first liquid 105. In this case, the vaporizable rust inhibitor can be used as it is, or the vaporizable rust inhibitor can be diluted by adding a solvent. When the vaporizable rust inhibitor is a solid, the vaporizable rust inhibitor and the solvent may be mixed.

It is preferable that the solvent can dissolve the vaporizable rust inhibitor and is less likely to react with the material of the base 101, the material of the first layer 102, and the material of the third layer 104. The solvent can be, for example, pure water or alcohols or the like. For example, the first liquid 105 can be a liquid including 20 ml of alcohol with respect to 1 gram of powdered Benz© triazole.

Figure 3A:
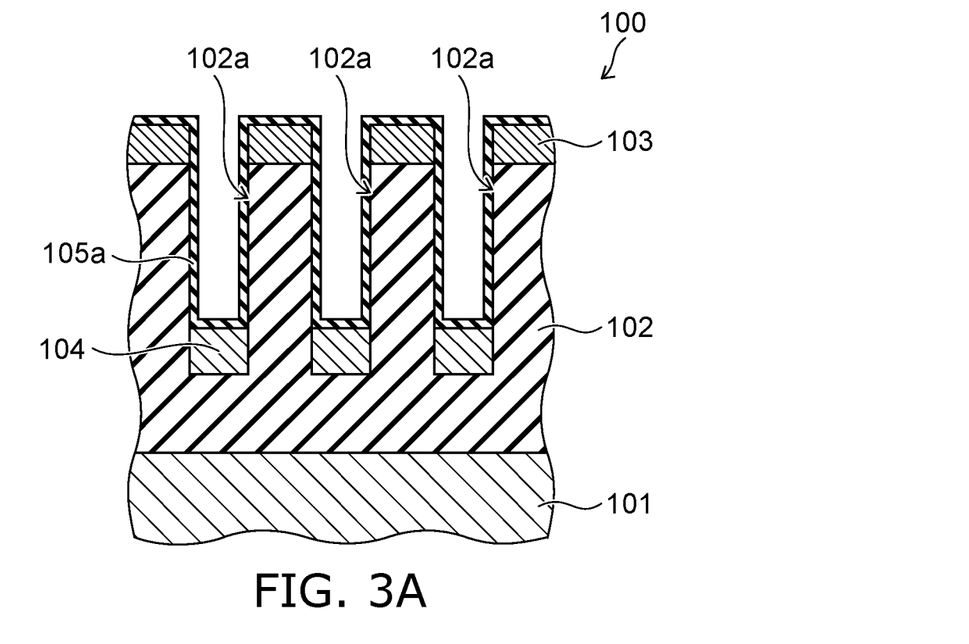
FIGS. 3A and 3B are schematic process cross-sectional views for illustrating the substrate treatment method.
Figure 3B:
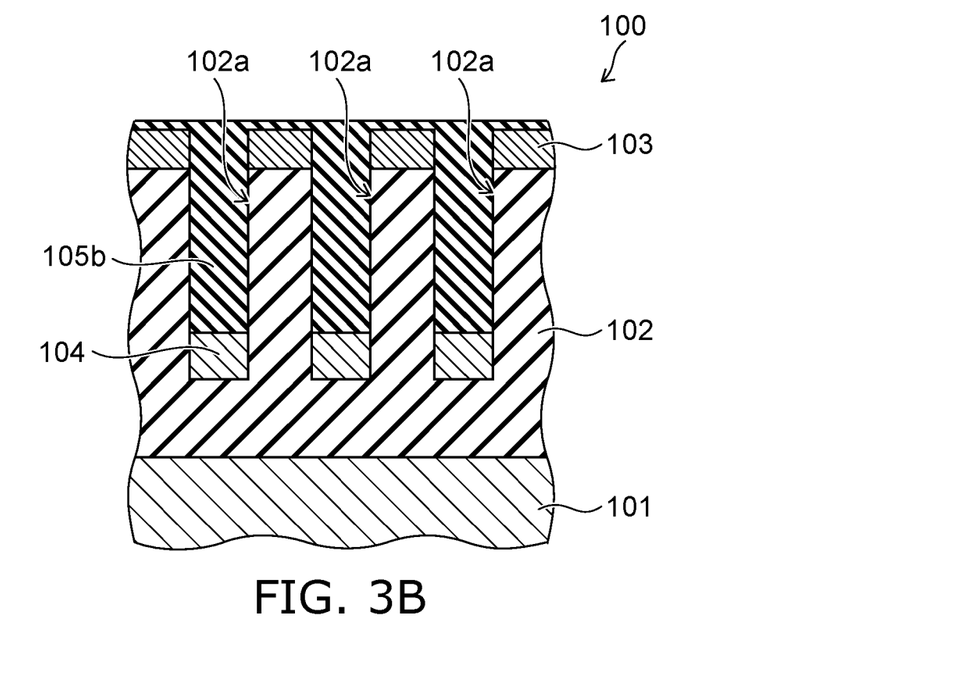

Next, as shown in FIGS. 3A and 3B, the first liquid 105 is dried to form the protective layers 105a and 105b which cover the surface of the substrate 100 on the side where the second layer 103 is provided. The protective layers 105a and 105b may be solid, or may be in the form of a gel having a viscosity that does not flow out from the surface of the substrate 100. The drying of the first liquid 105 may be, for example, natural drying or heat drying with a heater or the like. Further, the substrate 100 may be rotated or a gas such as nitrogen may be supplied to dry the substrate 100.

In this case, as shown in FIG. 3A, a film-like protective layer 105a covering the surface of the substrate 100 can be provided. For example, by rotating the substrate 100, a portion of the first liquid 105 can be drained to the outside of the substrate 100 by centrifugal force, and the first liquid 105 can be expanded to form a film-like protective layer 105a. If the film-shaped protective layer 105a is used, the protective layer 105a, which will be described later, can be easily removed. Therefore, it is possible to suppress the residue from remaining inside the recess 102a in the cleaning process described later.

The protective layer 105a has a function of protecting the side wall of the recess 102a and the like from the second liquid 106 described later. Therefore, if the thickness of the protective layer 105a is made too thin, the side wall of the recess 102a may be damaged. For example, the thickness of the protective layer 105a can be appropriately set in the range of several nm to several µm depending on the resistance to the second liquid 106. The thickness of the protective layer 105a can be appropriately determined by conducting experiments and simulations in advance.

Further, as shown in FIG. 3B, the inside of the recess 102a may be embedded by the protective layer 105b. The protective layer 105b has a function of protecting the side wall of the recess 102a and the like from the second liquid 106 described later. Therefore, if the protective layer 105b is embedded inside the recess 102a, it is possible to effectively suppress damage to the side wall of the recess 102a.

For example, when the second layer 103 to be removed is a metal mask or a resist mask having an altered layer on the surface, it is difficult to remove the second layer 103. Therefore, a highly reactive second liquid 106 (for example, the second liquid 106 including fluorine) is used. If the protective layer 105b is embedded inside the recess 102a, it is possible to effectively suppress the second liquid 106 from coming into contact with the side wall of the recess 102a. Therefore, even when the highly reactive second liquid 106 is used, it is possible to suppress the occurrence of damage to the side wall of the recess 102a and the like.

In the specification, "embedded" includes not only the case where the entire area inside the recess 102a is filled with the protective layer 105b, but also the case where, for example, a portion of the inside of the recess 102a is filled with the protective layer 105b, and the side wall of the recess 102a in the region where the protective layer 105b is not filled is covered with the film-like protective layer 105a.

Figure 4A:
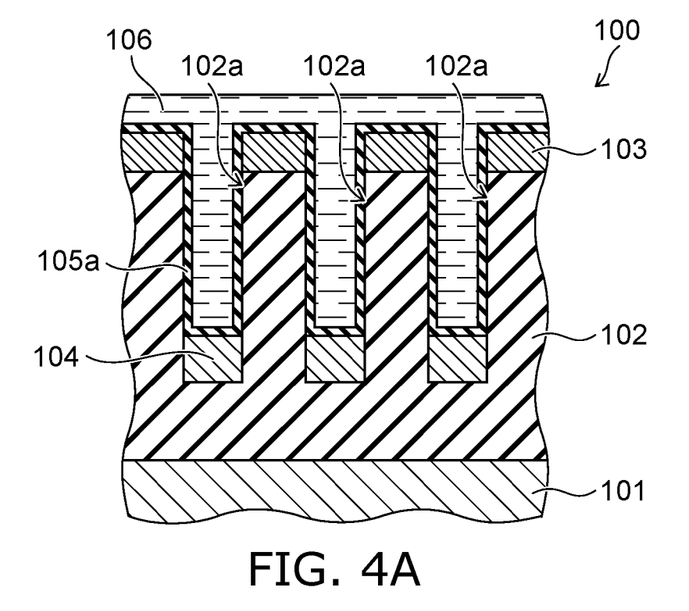
FIGS. 4A and 4B are schematic process cross-sectional views for illustrating the substrate treatment method.
Figure 4B:
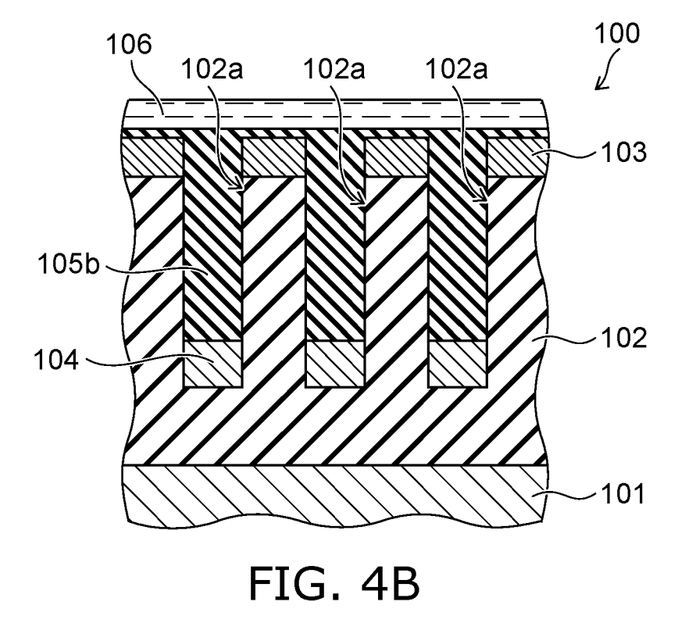

Next, as shown in FIGS. 4A and 4B, the second liquid 106 is supplied on the protective layers 105a and 105b. The second liquid 106 can be a liquid that easily reacts with the material of the second layer 103 to be removed. For example, the second liquid 106 includes a hydrogen peroxide solution, a hydrofluoric acid (hydrofluoric acid), an aqueous solution of potassium hydroxide, a mixed solution of hydrofluoric acid and nitric acid, an aqueous solution of tetramethylammonium hypochlorite, an aqueous solution of an oxidant having an oxyacid structure, ozone water, or the like. However, the second liquid 106 is not limited to the illustrated one, and may be any liquid that can dissolve the material of the second layer 103.

As described above, the protective layers 105a and 105b are formed from the first liquid 105 including a material that is difficult to react with the second liquid 106. Further, the protective layers 105a and 105b cover the second layer 103 to be removed. Therefore, the second layer 103 cannot be removed only by supplying the second liquid 106.

Figure 5A:
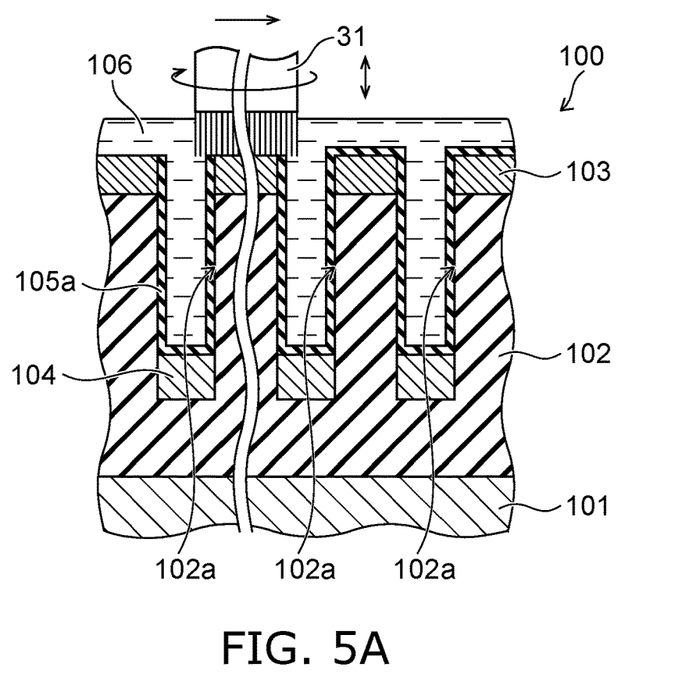
FIGS. 5A and 5B are schematic process cross-sectional views for illustrating the substrate treatment method.
Figure 5B:
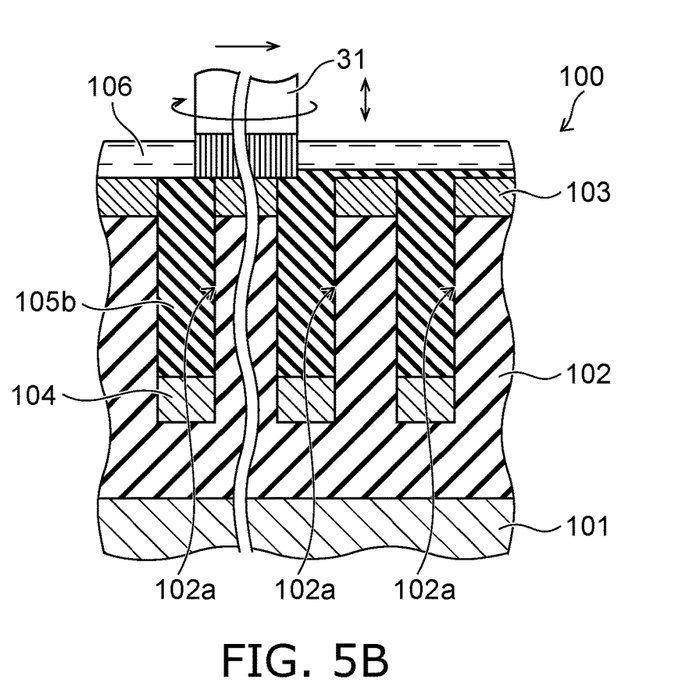

Therefore, next, the protective layers 105a and 105b on the upper surface of the second layer 103 are physically removed. For example, as shown in FIGS. 5A and 5B, the protective layers 105a and 105b on the upper surface of the second layer 103 can be removed by using the removal member 31 described later. The removal member 31 can be, for example, a bristle brush. For example, the bristle brush is rotated and pressed against the protective layers 105a and 105b on the upper surface of the second layer 103, and the pressed bristle brush is moved in the direction along the surface of the substrate 100, and thus the protective layers 105a and 105b on the upper surface can be removed. The material of the bristles of the bristle brush is not particularly limited as long as it has a certain degree of hardness, elasticity, and resistance to the second liquid 106. The material of the bristle can be, for example, nylon or polypropylene or the like. The bristle brush may be pressed against the protective layers 105a and 105b without rotating, and the pressed bristle brush may be moved in the direction along the surface of the substrate 100.

Further, the removal member 31 is not limited to the bristle brush, and may be any one capable of physically removing the protective layers 105a and 105b. For example, the removal member 31 may be a sponge brush such as a PVA brush, a brush using a porous material (for example, a fluororesin), or the like. As the removal member 31, a brush provided with both a bristle brush and a sponge brush can be used as one brush.

When the second layer 103 to be removed is a resist mask or the like having an altered layer on its surface, the removal member 31 may remove at least a portion of the altered layer, or also form scratches or holes in the altered layer. In this way, the second liquid 106 can be brought into contact with the easily removable resist underneath the altered layer. Further, since the reactivity of the second liquid 106 can be lowered, it is possible to suppress the occurrence of damage to the side wall of the recess 102a and the like.

When the protective layers 105a and 105b are physically removed, the materials of the protective layers 105a and 105b may adhere to the removal member 31. Therefore, it is preferable to clean the removal member 31 as needed or periodically. For example, the removal member 31 can be washed with a solvent, and the removal member 31 washed with the solvent can be further washed with pure water. The solvent for cleaning the removal member 31 can be, for example, a third liquid 107, which will be described later.

As shown in FIGS. 5A and 5B, when the protective layers 105a and 105b on the upper surface of the second layer 103 are removed, the second liquid 106 and the second layer 103 come into contact with each other. Therefore, the second layer 103 is dissolved (etched) by the second liquid 106. In this case, since the side wall and bottom of the recess 102*a* and the third layer 104 are covered with the protective layers 105*a* and 105*b*, it is possible to suppress the second liquid 106 from coming into contact with them to cause damage.

If at least a portion of the upper surface of the second layer 103 is exposed from the protective layers 105*a* and 105*b*, the second layer 103 can be dissolved. However, the larger the exposed area of the second layer 103, the easier it is to dissolve the second layer 103.

In this case, the end point of the removal work of the protective layers 105*a* and 105*b* can be determined, for example, by a predetermined work time. The working time can be appropriately determined in consideration of, for example, the material and thickness of the protective layers 105*a* and 105*b* on the upper surface of the second layer 103, the type of the removal member 31, the number of rotations, the moving speed, the number of moves, and the like. The end point of the removal work may be appropriately determined by conducting an experiment or a simulation in advance.

Further, although the protective layers 105*a* and 105*b* have resistance to the second liquid 106, they may be slightly dissolved by the second liquid 106. For example, if a portion of the film-like protective layer 105*a* is dissolved to form a hole or the like, the side wall or bottom of the recess 102*a* exposed inside the hole and the third layer 104 may be damaged.

According to the knowledge obtained by the inventor, if the component of the first liquid 105 is added to the second liquid 106, it is possible to suppress the protective layers 105*a* and 105*b* from becoming thin. That is, the second liquid 106 can also include the above-mentioned components such as hydrogen peroxide solution and a vaporizable rust inhibitor such as benzo triazole which is a component of the first liquid 105. The mechanism by which the thinning of the protective layers 105*a* and 105*b* is suppressed is not always clear, but it can be considered as follows. If the first liquid 105 is added to the second liquid 106, the added first liquid 105 adheres to the protective layers 105*a* and 105*b*. Since the attached first liquid 105 becomes the protective layers 105*a* and 105*b*, the thinned portions of the protective layers 105*a* and 105*b* are repaired.

Therefore, the first liquid 105 can be added to the second liquid 106 depending on the resistance of the protective layers 105*a* and 105*b* to the second liquid 106, the thickness of the protective layers 105*a* and 105*b*, and the like. The addition of the first liquid 105 can be performed, for example, on the surface of the substrate 100. In this case, the first liquid 105 and the second liquid 106 can be supplied at the same time, or the first liquid 105 and the second liquid 106 can be supplied alternately. In this way, the configuration of the supply device can be simplified.

Further, the first liquid 105 and the second liquid 106 can be mixed and the mixed liquid can be supplied to the surface of the substrate 100. For example, the mixed liquid stored in a tank or the like can be supplied to the surface of the substrate 100. For example, the first liquid 105 and the second liquid 106 can be mixed inside the piping and supplied to the surface of the substrate 100. When the mixed liquid is used, the ratio of the first liquid 105 and the second liquid 106 can be made substantially constant, so that the concentration of the second liquid 106 can be suppressed from being distributed on the surface of the substrate 100.

Further, the supply of the second liquid 106 or the supply of the mixed liquid of the first liquid 105 and the second liquid 106 can be continuously performed until the removal of the second layer 103 is completed. For example, the second liquid 106 or the mixed liquid can be a so-called flowing liquid, and in this way, it is possible to suppress the material of the second layer 103 and the like from remaining on the surface of the substrate 100.

Further, if the temperature of the second liquid 106 or the temperature of the mixed liquid of the first liquid 105 and the second liquid 106 is raised, the reactivity between the second liquid 106 or the mixed liquid and the second layer 103 can be can be increased, and thus the removal time of the second layer 103 can be shortened. However, when the temperature of the second liquid 106 or the temperature of the mixed liquid becomes high, the reactivity between the second liquid 106 or the mixed liquid and the protective layers 105*a* and 105*b* becomes high, and thus the thickness of the protective layers 105*a* and 105*b* is likely to become thin. Therefore, the temperature of the second liquid 106 or the temperature of the mixed liquid can be appropriately changed depending on the material and thickness of the protective layers 105*a* and 105*b*. The temperature of the second liquid 106 or the temperature of the mixed liquid can be appropriately determined by conducting experiments or simulations in advance. For example, the temperature of the second liquid 106 or the temperature of the mixed liquid can be room temperature (for example, about 25° C.)

Figure 6:
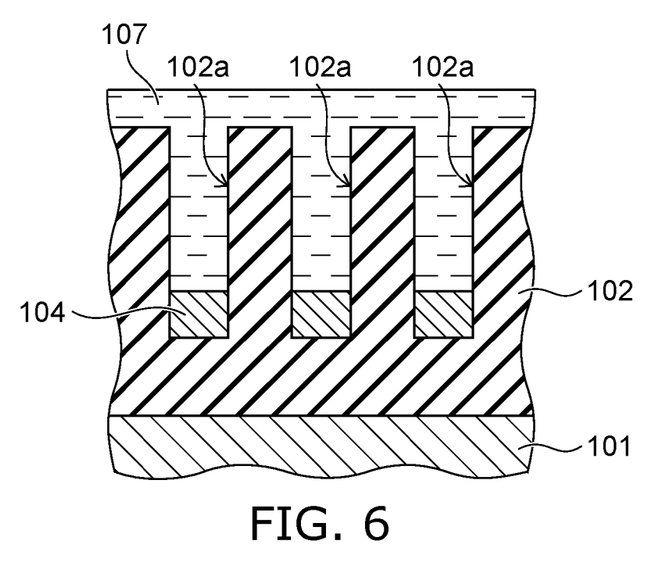
FIG. 6 is a schematic process cross-sectional view for illustrating the substrate treatment method.

Next, the protective layers 105*a* and 105*b* inside the recess 102*a* are removed. For example, as shown in FIG. 6, the protective layers 105*a* and 105*b* are dissolved and removed by supplying the third liquid 107 to the surface of the substrate 100. The third liquid 107 is not particularly limited as long as the protective layers 105*a* and 105*b* can be dissolved. The third liquid 107 can be, for example, alcohols such as IPA, glycol ethers such as 2-methoxy-1-methyl ether acetate (PGMEA; Propylene glycol methyl ether acetate), and the like.

In addition, the third liquid 107 can be supplied and the substrate 100 can also be rotated. By rotating the substrate 100, the dissolved protective layers 105*a* and 105*b* and the reacted third liquid 107 can be discharged to the outside of the substrate 100 by centrifugal force, so that the third liquid 107 before the reaction becomes easy to come into contact with the protective layers 105*a* and 105*b*. Further, it is possible to suppress the materials of the protective layers 105*a* and 105*b* from remaining on the surface of the substrate 100.

Figure 7:
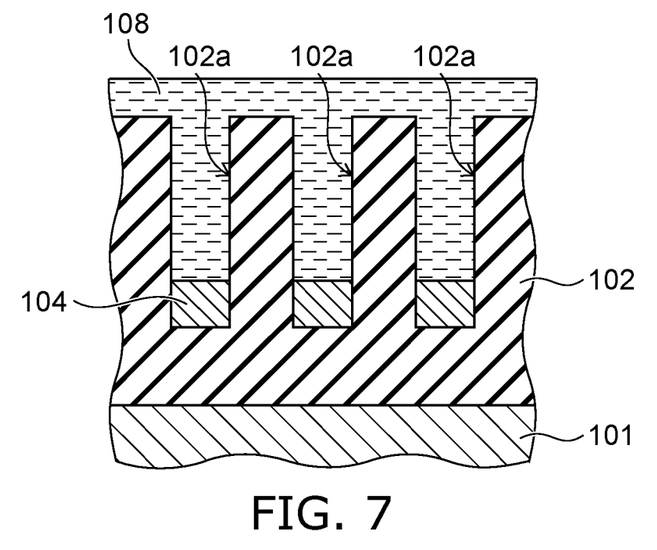
FIG. 7 is a schematic process cross-sectional view for illustrating the substrate treatment method.

Next, as shown in FIG. 7, a fourth liquid 108 is supplied to the surface of the substrate 100 to remove the materials of the protective layers 105*a* and 105*b* and the third liquid 107 remaining on the surface of the substrate 100. The fourth liquid 108 can be, for example, pure water such as DIW (Deionized water). In this case, the fourth liquid 108 can be supplied and the substrate 100 can be rotated. When the substrate 100 is rotated, the materials of the protective layers 105*a* and 105*b* remaining on the surface of the substrate 100 can be discharged to the outside of the substrate 100 together with the fourth liquid 108 by centrifugal force. Note that the treatment (cleaning) with the fourth liquid 108 is not always necessary and can be omitted. However, if the treatment with the fourth liquid 108 is performed, the surface of the substrate 100 becomes cleaner.

Next, the substrate 100 is dried. For example, the substrate 100 is rotated, and the third liquid 107 and the fourth liquid 108 remaining on the surface of the substrate 100 are discharged to the outside of the substrate 100 by centrifugal force. Further, by rotating the substrate 100, the air flow is brought into contact with the surface of the substrate 100. If the substrate 100 is rotated, the time required for drying can be shortened. A fan for sending air to the surface of the substrate 100, a hot air heater, and the like can be appropriately provided.

As described above, the second layer 103 can be removed.

As described above, the substrate treatment method according to the embodiment is a substrate treatment method for removing the upper end of the protrusion in the substrate 100 having an unevenness formed on the surface 100a, and includes the following steps.

A process of supplying the first liquid 105 to the surface 100a of the substrate 100 on which the unevenness is formed.

A process of forming protective layers 105a and 105b covering the surface 100a of the substrate 100 from the first liquid 105 supplied to the surface 100a of the substrate.

A process of supplying the second liquid 106 on the protective layers 105a and 105b.

A process of physically removing the protective layers 105a and 105b at the upper end of the convex portion (second layer 103) and bringing the second liquid 106 into contact with the upper end of the convex portion from which the protective layers 105a and 105b have been removed.

According to the substrate treatment method according to the embodiment, when the second layer 103 such as the hard mask that is no longer needed is removed, the side wall or bottom of the recess 102a or the third layer 104 is protected by 105a and 105b. Therefore, it is possible to suppress damage to the side wall or bottom of the recess 102a or the third layer 104. That is, according to the substrate treatment method according to the embodiment, in the substrate 100 having an unevenness formed on the surface 100a, the upper end (second layer 103) of the protrusion can be removed, and it is possible to suppress the occurrence of damage to the recess 102a.

(Substrate Treatment Apparatus)

Next, the substrate treatment apparatus 1 according to the embodiment will be described.

Figure 8:
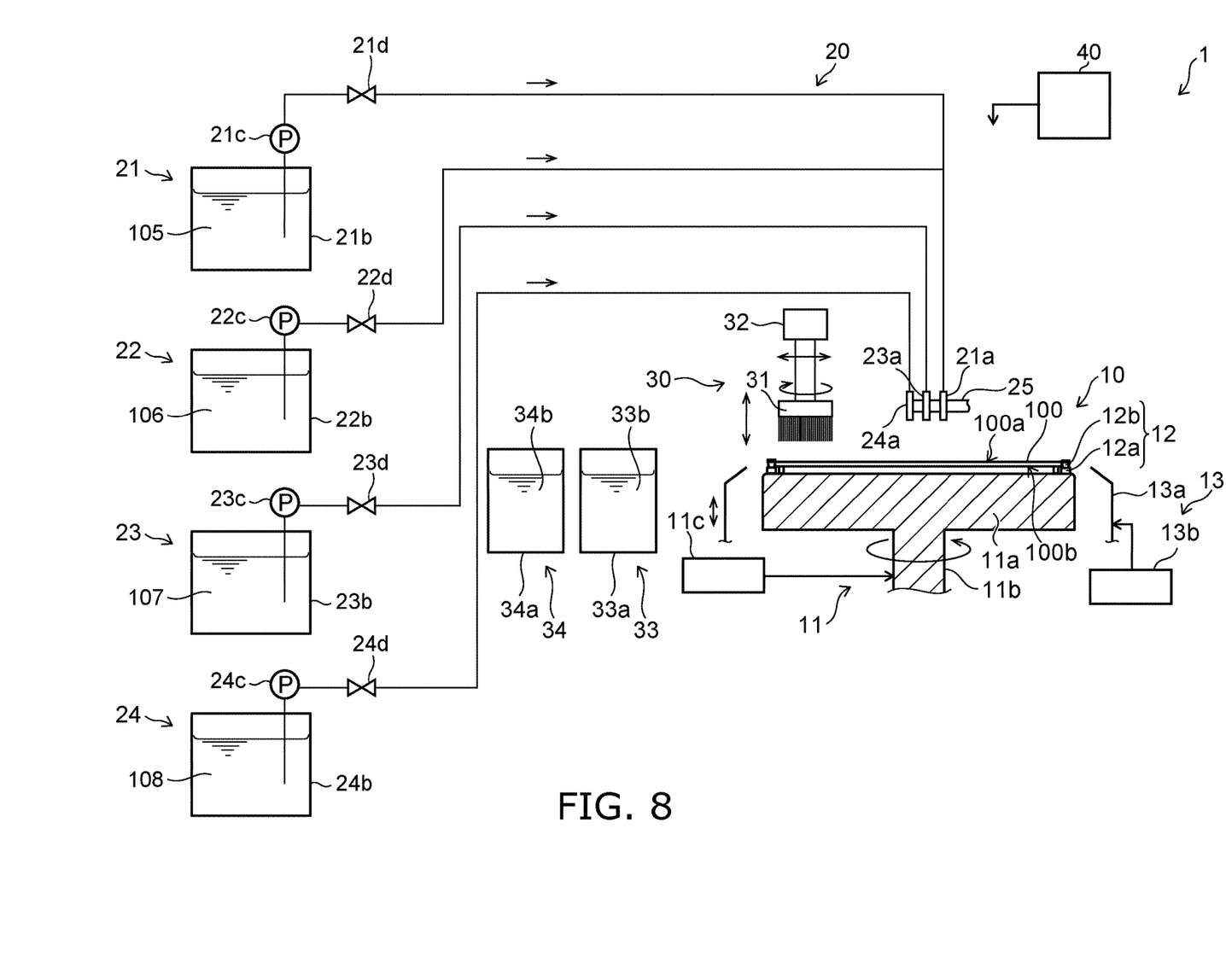
FIG. 8 is a schematic view for illustrating a substrate treatment apparatus.

The substrate treatment apparatus 1 can remove the upper end of the protrusion on the substrate 100 having an unevenness formed on the surface 100a.

FIG. 8 is a schematic diagram for illustrating the substrate treatment apparatus 1.

As shown in FIG. 8, the substrate treatment apparatus 1 can be provided with a placement part 10, a liquid supplier 20, a removal part 30, and a controller 40.

The placement part 10 supports the substrate 100 and rotates the supported substrate 100. The placement part 10 includes, for example, a rotation part 11, a supporter 12, and a recovery part 13.

The rotation part 11 includes, for example, a base pedestal 11a, a shaft 11b, and a drive part 11c. The base pedestal 11a has a plate shape. The shaft 11b has a columnar shape and is connected to the surface of the base pedestal 11a opposite to the side on which the supporter 12 is provided. For example, the shaft 11b can be integrally formed with the base pedestal 11a. The drive part 11c rotates the base pedestal 11a and stops the rotation via the shaft 11b. Further, the drive part 11c can control the rotation speed of the base pedestal 11a. The drive part 11c may be provided with a control motor such as a servo motor, for example.

Multiple supporters 12 can be provided. The supporter 12 includes a first portion 12a and a second portion 12b. The first portion 12a has a columnar shape and is provided on the surface of the base pedestal 11a opposite to the side on which the shaft 11b is provided. The first portion 12a is provided near the peripheral edge of the base pedestal 11a. The second portion 12b has a columnar shape and is provided on the end surface of the first portion 12a on the side opposite to the base pedestal 11a side. The second portion 12b is thinner than the first portion 12a. The first portion 12a and the second portion 12b can be integrally formed.

When the substrate 100 is placed on the multiple supporters 12, the end surface of the first portion 12a provided with the second portion 12b is in contact with the back surface 100b of the substrate 100 (the surface opposite to the side where the second layer 103 is provided). Further, the side surface of the second portion 12b is in contact with the side surface of the substrate 100 or faces the side surface of the substrate 100 through a slight gap. If the second portion 12b is provided, it is possible to suppress the substrate 100 from being displaced due to centrifugal force.

The recovery part 13 includes, for example, a cup 13a and a movement part 13b.

The cup 13a has a tubular shape. The base pedestal 11a, the shaft 11b, and the supporter 12 can be provided inside the cup 13a. That is, the cup 13a can surround the base pedestal 11a. The end of the cup 13a on the base pedestal 11a side is open. A bottom plate can be provided at the end of the cup 13a on the side opposite to the base pedestal 11a side. The shaft 11b is inserted through the inside of a hole provided in the bottom plate. The end of the shaft 11b on the side opposite to the base pedestal 11a side is provided on the outside of the cup 13a, and the drive part 11c is connected to the shaft 11b. A hole can be provided in the bottom plate of the cup 13a. The holes can be connected to the recovery tank via piping. The first liquid 105, the second liquid 106, the third liquid 107, and the fourth liquid 108, which are supplied to the surface 100a of the substrate 100 and discharged to the outside of the substrate 100 by centrifugal force, are captured by the inner wall of the cup 13a. Since the opening side of the cup 13a is tilted inward, it is possible to suppress these liquids from scattering to the outside of the cup 13a. These liquids captured by the inner wall of the cup 13a are stored inside the cup 13a and sent to the recovery tank via the piping.

The movement part 13b changes the position of the cup 13a in the central axis direction of the rotation part 11. The movement part 13b may be provided with, for example, an air cylinder or the like. For example, when the substrate 100 is placed on the supporter 12 or when the substrate 100 is taken out from the supporter 12, the position of the cup 13a is lowered by the movement part 13b as shown in FIG. 8, and the supporter 12 is located near the opening of the cup 13a. In this way, the substrate 100 can be easily delivered. On the other hand, when a liquid such as the first liquid 105 is supplied to the surface 100a of the substrate 100, the position of the cup 13a is raised by the movement part 13b so that the substrate 100 is located inside the cup 13a. In this way, it becomes easy to capture the liquid discharged to the outside of the substrate 100.

The liquid supplier 20 includes, for example, a first supplier 21, a second supplier 22, a third supplier 23, and a fourth supplier 24.

The first supplier 21 supplies the first liquid 105 to the surface 100a on which the unevenness of the substrate 100 is formed.

The first supplier 21 includes, for example, a nozzle 21a, a tank 21b, a pump 21c, and a control valve 21d.

The nozzle 21a has a tubular shape, and the end portion on the opening side faces the vicinity of the center of the surface 100a of the substrate 100. The nozzle 21a may be a nozzle that discharges the first liquid 105 as it is, or may be a spray nozzle that atomizes and sprays the first liquid 105. The first liquid 105 supplied near the center of the surface 100a of the substrate 100 is spread on the surface 100a of the substrate 100 by the centrifugal force due to the rotation of the substrate 100.

The tank 21b stores the first liquid 105.

The pump 21c is provided between the nozzle 21a and the tank 21b, and supplies the first liquid 105 stored in the tank 21b to the nozzle 21a.

The control valve 21d is provided between the pump 21c and the nozzle 21a, and switches between supplying and stopping the supply of the first liquid 105. Further, the control valve 21d may further control the flow rate, pressure, and the like of the first liquid 105.

The second supplier 22 supplies the second liquid 106 on the protective layers 105a and 105b covering the surface 100a of the substrate 100, the second liquid 106 is formed from the first liquid 105 supplied to the surface 100a of the substrate 100.

The second supplier 22 includes, for example, the nozzle 21a, a tank 22b, a pump 22c, and a control valve 22d. Although the case where the nozzle 21a used for supplying the first liquid 105 is also used for supplying the second liquid 106 has been illustrated, a nozzle used only for supplying the second liquid 106 may be separately provided. The second liquid 106 supplied near the center of the surface 100a of the substrate 100 is spread on the surface 100a of the substrate 100 by the centrifugal force due to the rotation of the substrate 100.

The tank 22b stores the second liquid 106.

The pump 22c is provided between the nozzle 21a and the tank 22b, and supplies the second liquid 106 stored in the tank 22b to the nozzle 21a.

The control valve 22d is provided between the pump 22c and the nozzle 21a, and switches between supplying and stopping the supply of the second liquid 106. Further, the control valve 22d may further control the flow rate, pressure, and the like of the second liquid 106.

The third supplier 23 supplies the third liquid 107 to the surface 100a of the substrate 100. The third supplier 23 includes, for example, a nozzle 23a, a tank 23b, a pump 23c, and a control valve 23d.

The nozzle 23a has a tubular shape, and the end portion on the opening side faces the vicinity of the center of the surface 100a of the substrate 100. The nozzle 23a may be a nozzle that discharges the third liquid 107 as it is, or may be a spray nozzle that atomizes and sprays the third liquid 107. The third liquid 107 supplied near the center of the surface 100a of the substrate 100 is spread on the surface 100a of the substrate 100 by the centrifugal force due to the rotation of the substrate 100.

The tank 23b stores the third liquid 107.

The pump 23c is provided between the nozzle 23a and the tank 23b, and supplies the third liquid 107 stored in the tank 23b to the nozzle 23a.

The control valve 23d is provided between the pump 23c and the nozzle 23a, and switches between supplying and stopping the supply of the third liquid 107. Further, the control valve 23d may further control the flow rate, pressure, and the like of the third liquid 107.

The fourth supplier 24 supplies the fourth liquid 108 to the surface 100a of the substrate 100. The fourth supplier 24 includes, for example, a nozzle 24a, a tank 24b, a pump 24c, and a control valve 24d.

The nozzle 24a has a tubular shape, and the end portion on the opening side faces the vicinity of the center of the surface 100a of the substrate 100. The nozzle 24a may be a nozzle that discharges the fourth liquid 108 as it is, or may be a spray nozzle that atomizes and sprays the fourth liquid 108. The fourth liquid 108 supplied near the center of the surface 100a of the substrate 100 is spread on the surface 100a of the substrate 100 by the centrifugal force due to the rotation of the substrate 100.

The tank 24b stores the fourth liquid 108.

The pump 24c is provided between the nozzle 24a and the tank 24b, and supplies the fourth liquid 108 stored in the tank 24b to the nozzle 24a.

The control valve 24d is provided between the pump 24c and the nozzle 24a, and switches between supplying and stopping the supply of the fourth liquid 108. Further, the control valve 24d may further control the flow rate, pressure, and the like of the fourth liquid 108.

The nozzles 21a, 23a, and 24a can also be used in combination. For example, the supply of the first liquid 105, the second liquid 106, the third liquid 107, and the fourth liquid 108 may be switched so that these liquids are sequentially supplied from one nozzle.

Further, the nozzles 21a, 23a, 24a may be attached to a swing arm 25 or the like to change the positions of the nozzles 21a, 23a, 24a. For example, when the first liquid 105 to the fourth liquid 108 are supplied to the surface 100a of the substrate 100, the swing arm 25 can be located so that the nozzles 21a, 23a, and 24a are above the central region of the surface 100a of the substrate 100. When delivering the substrate 100 to the supporter 12, the swing arm 25 can retract the nozzles 21a, 23a, and 24a to the outside of the cup 13a. The swing arm 25 can be driven by, for example, an air cylinder, a control motor such as a servomotor, or the like.

The removal part 30 physically removes the protective layers 105a and 105b at the upper end of the protrusion (second layer 103), and brings the second liquid 106 in contact with the upper end of the protrusion (second layer 103) from which the protective layers 105a and 105b have been removed.

The removal part 30 includes, for example, the removal member 31, a drive part 32, a cleaning part 33, and a cleaning part 34.

The removal member 31 can come into contact with the protective layer 100a at the upper end (second layer 103) of the protrusion. As described above, the removal member 31 can be, for example, a bristle brush. Since the removal member 31 can be the same as that described above, detailed description thereof will be omitted.

The drive part 32 can execute at least one of the rotation of the removal member 31 and the movement of the removal member 31. The drive part 32 rotates, for example, the removal member 31. Further, the drive part 32 moves, for example, the removal member 31 in a direction perpendicular to the surface 100a of the substrate 100. Further, the drive part 32 moves the removal member 31 in a direction along the surface 100a of the substrate 100, for example. For example, the drive part 32 can press the bristle brush against the protective layer 105a at the upper end (second layer 103) of the protrusion, and can move the bristle brush in a direction along the surface 100a of the substrate 100. In this case, the drive part 32 can also rotate the bristle brush further. The drive part 32 may be provided with, for example, a control motor such as a servomotor, an air cylinder, a guide mechanism, or the like.

The cleaning part 33 includes, for example, a tank 33a and a cleaning liquid 33b.

The tank 33a may have an open upper end, for example. The cleaning liquid 33b is stored in the tank 33a.

The cleaning liquid 33b can be a solvent capable of dissolving the materials of the protective layers 105a and 105b adhering to the removal member 31. The cleaning liquid 33b can be, for example, the third liquid 107.

Since the upper end of the tank 33a is open, the drive part 32 can move the removal member 31 from above the surface 100a of the substrate 100 to the inside of the cleaning liquid 33b. In this way, the removal member 31 can be cleaned with the cleaning liquid 33b. Further, the drive part 32 can rotate the removal member 31 immersed in the cleaning liquid 33b, change the rotation speed, and alternately reverse the rotation direction. By doing so, the cleaning effect of the removal member 31 can be improved.

The cleaning part 34 includes, for example, a tank 34a and a cleaning liquid 34b.

The tank 34a may have an open upper end, for example. The cleaning liquid 34b is stored in the tank 34a.

The cleaning liquid 34b can be, for example, pure water or the like. The cleaning liquid 34b may be, for example, a fourth liquid 108.

Since the upper end of the tank 34a is open, the drive part 32 can move the removal member 31 from above the surface 100a of the substrate 100 to the inside of the cleaning liquid 34b. In this way, the removal member 31 can be cleaned with the cleaning liquid 34b. Further, the drive part 32 can rotate the removal member 31 immersed in the cleaning liquid 34b, change the rotation speed, and alternately reverse the rotation direction. By doing so, the cleaning effect of the removing member 31 can be improved.

Depending on the material adhering to the removal member 31, the liquid component, the adhering amount, and the like, cleaning may be performed with either the cleaning liquid 33b or the cleaning liquid 34b. Therefore, at least one of the cleaning part 33 and the cleaning part 34 may be provided.

That is, the substrate treatment apparatus 1 can further include the tanks 33a and 34a for storing the cleaning liquids 33b and 34b. The drive part 32 can move the removal member 31 inside the tanks 33a and 34a and immerse the removal member 31 in the cleaning liquids 33b and 34b.

The controller 40 can include, for example, a calculation part such as a CPU (Central Processing Part) and a storage part such as a memory. The controller 40 can be, for example, a computer or the like. The controller 40 controls the operation of each element provided in the substrate treatment apparatus 1 based on, for example, a control program stored in the storage part.

The controller 40 can execute the above-described substrate treatment method based on, for example, the control program stored in the storage part.

For example, the controller 40 controls the drive part 11c to rotate the substrate 100, and controls the first supplier 21 (pump 21c, control valve 21d) to supply the liquid 105 to the surface 100a on which the unevenness of the substrate 100 is formed.

For example, after the supply of the first liquid 105, the controller 40 controls the drive part 11c to rotate the substrate 100, and the first liquid 105 is dried, and thus the protective layer 105a and 105b covering the surface 100a of the substrate 100 are formed.

For example, the controller 40 controls the second supplier 22 (pump 22c, control valve 22d) to supply the second liquid 106 on the protective layers 105a and 105b which are formed from the first liquid 105 supplied to the surface 100a of the substrate 100 and cover the surface 100a of the substrate 100.

In this case, the controller 40 controls the first supplier 21 (pump 21c, control valve 21d) and the second supplier 22 (pump 22c, control valve 22d) and can also supply the first liquid 105 and the second Liquid 106 to the surface 100a of the substrate 100 on which the protective layers 105a and 105b are formed. At this time, the first liquid 105 and the second liquid 106 can be mixed inside the piping or the nozzle, and the mixed liquid can be supplied to the surface 100a of the substrate 100. Further, the first liquid 105 and the second liquid 106 are alternately supplied to the surface 100a of the substrate 100, and thereby a mixed liquid can also be generated on the surface 100a of the substrate 100. The mixed liquid can be stored in the tank 22b, and the mixed liquid can be supplied instead of the second liquid 106.

For example, the controller 40 controls the removal part 30 (drive part 32) to physically remove the protective layers 105a and 105b at the upper end (second layer 103) of the protrusion, and the second liquid 106 is brought into contact with the upper end (second layer 103) of the protrusion. The protective layer 105a is removed from the upper end. When the second liquid 106 and the second layer 103 come into contact with each other, the second liquid 106 dissolves (etches) the second layer 103.

For example, the controller 40 controls the third supplier 23 (pump 23c, control valve 23d) to supply the third liquid 107 to the surface 100a of the substrate 100 from which the second layer 103 has been removed. The third liquid 107 removes the protective layers 105a and 105b inside the recess 102a. The controller 40 controls the drive part 11c to rotate the substrate 100, and can discharge the dissolved protective layers 105a and 105b and the reacted third liquid 107 to the outside of the substrate 100 by centrifugal force.

For example, the controller 40 controls the fourth supplier 24 (pump 24c, control valve 24d) to supply the fourth liquid 108 to the surface 100a of the substrate 100 treated by the third liquid 107. The surface 100a of the substrate 100 is cleaned by the fourth liquid 108. In this case, the controller 40 can control the drive part 11c to rotate the substrate 100 and discharge the fourth liquid 108 to the outside of the substrate 100 by centrifugal force.

For example, the controller 40 controls the drive part 11c to rotate the substrate 100 and dry the surface 100a of the substrate 100 cleaned with the fourth liquid 108.

For example, the controller 40 can control the removal part 30 (drive part 32) to immerse the removal member 31 in the cleaning liquids 33b and 34b. By immersing the removal member 31 in the cleaning liquids 33b and 34b, the materials of the protective layers 105a and 105b adhering to the removal member 31 can be removed. At this time, the controller 40 can control the removal part 30 (drive part 32) to rotate the removal member 31 immersed in the cleaning liquids 33b and 34b, change the rotation speed, and alternately reverse the rotation direction. By doing so, the cleaning effect of the removal member 31 can be improved.

Further, the controller 40 controls the first supplier 21, the second supplier 22, the third supplier 23, and the fourth supplier 24, and supplies the first liquid 105, the second liquid 106, the third liquid 107, and the fourth liquid 108 to the surface 100a of the substrate 100. At this time, the controller 40 can control the drive part 11c to rotate the substrate 100 at a rotation speed corresponding to each liquid (first liquid 105, second liquid 106, third liquid 107, and fourth liquid 108). The rotation of the substrate 100 may be switched to a rotation speed according to the next liquid to be supplied between the time when the supply of the liquid is stopped and the time when the supply of the next liquid is started. Further, the rotation of the substrate 100 may be stopped when the liquid to be supplied is changed. Further, the rotation speed of the substrate 100 may be kept constant while the liquid is being supplied from one supplier, or the rotation speed may be switched. Of course, it is not always necessary to rotate the substrate 100, and only the liquid can be supplied without rotating the substrate 100.

Since the treatment procedure of the substrate 100, the liquid to be used, the work effect, and the like can be the same as those described above, detailed description thereof will be omitted.

Hereinabove, exemplary embodiments are described. However, the invention is not limited to these descriptions.

Those skilled in the art can suitably modify the above embodiments by addition, omission, or design change of processes, or by addition, deletion, or condition change of components, and such modifications are also encompassed within the scope of the invention as long as they fall within the spirit of the invention.

The components included in the embodiments described above can be combined to the extent of technical feasibility and the combinations are included in the scope of the invention to the extent that the feature of the invention is included.

What is claimed is:

1. A substrate treatment apparatus removing an upper end of a protrusion in a substrate, an unevenness being formed on a surface of the substrate, the apparatus comprising:
    a first supplier configured to supply a first liquid onto the surface of the substrate to form a protective layer on the surface of the substrate;
    a second supplier configured to supply a second liquid onto the protective layer covering the surface of the substrate, the second liquid being capable of dissolving the upper end of the protrusion;
    a removal part configured to physically remove a portion of the protective layer being on the upper end of the protrusion to bring the second liquid into contact with the upper end of the protrusion, thereby dissolving the upper end of the protrusion with the second liquid;
    a third supplier configured to supply a third liquid capable of dissolving the protective layer onto the surface of the substrate to remove a remaining portion of the protective layer not previously removed by the removal part; and
    a controller controlling the first supplier, the second supplier, the removal part, and the third supplier, the controller being configured to perform following steps;
        a step of controlling the first supplier to supply the first liquid to the surface of the substrate on which the irregularities being formed;
        a step of controlling the second supplier to supply the second liquid onto the protective layer formed by the first liquid;
        a step of controlling the removal part to physically remove the portion of the protective layer on the upper end of the protrusion, thereby bringing the second liquid into contact with the upper end of the protrusion and dissolving the upper end of the protrusion with the second liquid; and
        a step of controlling the third supplier to supply the third liquid to the surface on which the unevenness being formed so as to remove a remaining portion of the protective layer that has not been removed by the removal part.

2. The apparatus according to claim 1, wherein the removal part includes
    a removal member configured to contact the protective layer, the protective layer being on the upper end of the protrusion, and
    a drive part configured to execute at least one of rotating the removal member or moving the removal member.

3. The apparatus according to claim 2, wherein the removal member is a bristle brush, and
the drive part is configured to press the bristle brush against the protective layer, the protective layer being on the upper end of the protrusion, and to move the bristle brush in a direction along the surface of the substrate.

4. The apparatus according to claim 3, wherein the drive part is further configured to rotate the bristle brush.

5. The apparatus according to claim 2, wherein the removal member is at least one of a sponge brush or a brush using a porous material, and
the drive part is configured to press the sponge brush or the brush using the porous material against the protective layer, the protective layer being on the upper end of the protrusion, and to move the sponge brush or the brush using the porous material in a direction along the surface of the substrate.

6. The apparatus according to claim 2, further comprising:
a tank configured to store a cleaning liquid,
the drive part is configured to move the removal member inside the tank and to immerse the removal member in the cleaning liquid.

* * * * *